(12) United States Patent
Liu et al.

(10) Patent No.: US 9,048,283 B2
(45) Date of Patent: Jun. 2, 2015

(54) HYBRID BONDING SYSTEMS AND METHODS FOR SEMICONDUCTOR WAFERS

(75) Inventors: Ping-Yin Liu, Yonghe (TW); Shih-Wei Lin, Taipei (TW); Xin-Hua Huang, Xihu Township (TW); Lan-Lin Chao, Sindian (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 226 days.

(21) Appl. No.: 13/542,507

(22) Filed: Jul. 5, 2012

(65) Prior Publication Data

US 2014/0011324 A1 Jan. 9, 2014

(51) Int. Cl.
*H01L 21/30* (2006.01)
*H01L 23/00* (2006.01)

(52) U.S. Cl.
CPC ............ *H01L 24/74* (2013.01); *Y10T 156/15* (2015.01); *Y10T 156/1744* (2015.01); *H01L 2224/80013* (2013.01); *H01L 2224/8001* (2013.01); *H01L 2224/74* (2013.01); *H01L 2224/80075* (2013.01); *H01L 2224/80011* (2013.01); *H01L 2224/80065* (2013.01); *H01L 2224/02215* (2013.01); *H01L 24/03* (2013.01); *H01L 24/05* (2013.01); *H01L 24/08* (2013.01); *H01L 24/80* (2013.01); *H01L 24/94* (2013.01); *H01L 2224/0361* (2013.01); *H01L 2224/0381* (2013.01); *H01L 2224/05647* (2013.01); *H01L 2224/05687* (2013.01); *H01L 2224/08145* (2013.01); *H01L 2224/80121* (2013.01); *H01L 2224/80895* (2013.01); *H01L 2224/80896* (2013.01); *H01L 2224/94* (2013.01); *H01L 2224/80203* (2013.01);

(Continued)

(58) Field of Classification Search
CPC ................................................ H01L 21/76245
USPC .................................... 438/455, 908; 156/381
See application file for complete search history.

(56) References Cited

U.S. PATENT DOCUMENTS 6,153,524 A * 11/2000 Henley et al. ................. 438/691
6,276,433 B1 8/2001 Gigliotti, Jr. et al.
(Continued)

FOREIGN PATENT DOCUMENTS

KR 20010009429 2/2001
KR 1020010071508 A 7/2001
(Continued)

*Primary Examiner* — Mary Wilczewski
*Assistant Examiner* — Toniae Thomas
(74) *Attorney, Agent, or Firm* — Slater & Matsil, L.L.P.

(57) ABSTRACT

Hybrid bonding systems and methods for semiconductor wafers are disclosed. In one embodiment, a hybrid bonding system for semiconductor wafers includes a chamber and a plurality of sub-chambers disposed within the chamber. A robotics handler is disposed within the chamber that is adapted to move a plurality of semiconductor wafers within the chamber between the plurality of sub-chambers. The plurality of sub-chambers includes a first sub-chamber adapted to remove a protection layer from the plurality of semiconductor wafers, and a second sub-chamber adapted to activate top surfaces of the plurality of semiconductor wafers prior to hybrid bonding the plurality of semiconductor wafers together. The plurality of sub-chambers also includes a third sub-chamber adapted to align the plurality of semiconductor wafers and hybrid bond the plurality of semiconductor wafers together.

20 Claims, 5 Drawing Sheets (52) U.S. Cl.
CPC ............... *H01L 2224/03616* (2013.01); *H01L 2224/80004* (2013.01); *H01L 2224/80014* (2013.01); *H01L 2224/75824* (2013.01); *H01L 2224/7565* (2013.01); *H01L 2224/75753* (2013.01); *H01L 2224/75101* (2013.01); *H01L 2224/7501* (2013.01); *H01L 2924/1461* (2013.01)

(56) References Cited

U.S. PATENT DOCUMENTS

| | | |
|---|---|---|
| 6,962,835 B2 | 11/2005 | Tong et al. |
| 7,385,283 B2 | 6/2008 | Wu et al. |
| 2001/0020737 A1 | 9/2001 | Kwon et al. |
| 2004/0216673 A1* | 11/2004 | Sakata et al. ................ 118/719 |
| 2007/0145367 A1 | 6/2007 | Chen et al. |
| 2007/0281438 A1 | 12/2007 | Liu et al. |
| 2009/0140404 A1 | 6/2009 | Chen et al. |
| 2010/0261332 A1 | 10/2010 | Kim et al. |
| 2011/0027945 A1 | 2/2011 | Saitou et al. |
| 2012/0126425 A1 | 5/2012 | Farooq et al. |
| 2013/0320556 A1* | 12/2013 | Liu et al. ..................... 438/455 |

FOREIGN PATENT DOCUMENTS

| | | |
|---|---|---|
| KR | 1020080105956 A | 12/2008 |
| KR | 10-2011-0134139 | 12/2011 |
| KR | 10-2012-0034786 | 4/2012 |
| WO | 9965803 A1 | 12/1999 |

* cited by examiner

HYBRID BONDING SYSTEMS AND METHODS FOR SEMICONDUCTOR WAFERS

CROSS-REFERENCE TO RELATED APPLICATIONS

This application relates to the following co-pending and commonly assigned patent application Ser. No. 13/488,745, filed on Jun. 5, 2012, entitled, "Three Dimensional Integrated Circuit Structures and Hybrid Bonding Methods for Semiconductor Wafers," which application is hereby incorporated herein by reference.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. 3DICs provide improved integration density and other advantages, such as faster speeds and higher bandwidth, because of the decreased length of interconnects between the stacked dies, as examples.

Hybrid bonding is one type of bonding procedure for 3DICs, wherein two semiconductor wafers are bonded together using a hybrid bonding technique. Some methods of forming 3DICs are described in patent application Ser. No. 13/488,745, filed on Jun. 5, 2012, entitled, "Three Dimensional Integrated Circuit Structures and Hybrid Bonding Methods for Semiconductor Wafers," which application is hereby incorporated herein by reference.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of the embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure are related to 3DIC packaging of semiconductor devices. Novel hybrid bonding systems and method for semiconductor wafers will be described herein.

Figure 1:
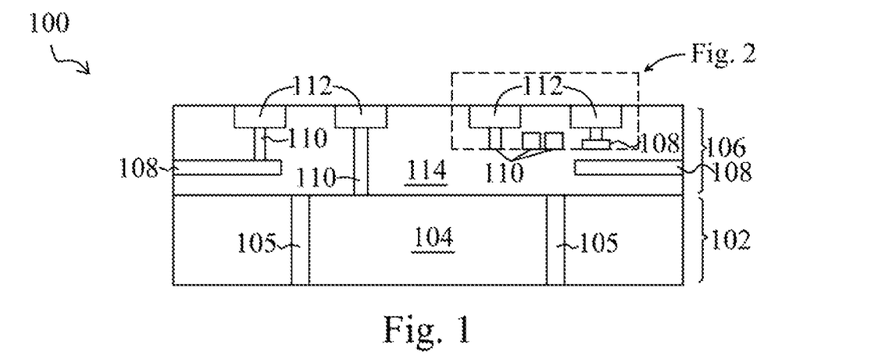
FIG. 1 is a cross-sectional view of a portion of a semiconductor wafer in accordance with an embodiment of the present disclosure.

Referring first to FIG. 1, there is shown a cross-sectional view of a portion of a semiconductor wafer 100 in accordance with an embodiment of the present disclosure. Two or more semiconductor wafers such as the wafer 100 illustrated will be coupled together vertically using a novel hybrid bonding system and process in accordance with embodiments herein.

The semiconductor wafer 100 includes a workpiece 102. The workpiece 102 includes a semiconductor substrate comprising silicon or other semiconductor materials and may be covered by an insulating layer, for example. The workpiece 102 may comprise silicon oxide over single-crystal silicon, for example. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

The workpiece 102 may include a device region 104 formed proximate a top surface of the workpiece 102. The device region 104 includes active components or circuits, such as conductive features, implantation regions, resistors, capacitors and other semiconductor elements, e.g., transistors, diodes, etc. The device region 104 is formed over the workpiece 102 in a front-end-of-line (FEOL) process in some embodiments, for example. The workpiece 102 may also include through-substrate vias (TSVs) 105 comprising a conductive material that provide connections from a bottom side to a top side of the workpiece 102, as shown.

A metallization structure 106 is formed over the workpiece 102, e.g., over the device region 104 of the workpiece 102. The metallization structure 106 is formed over the workpiece 102 in a back-end-of-line (BEOL) process in some embodiments, for example. The metallization structure 106 includes conductive features, such as conductive lines 108, vias 110, and conductive pads 112 formed in an insulating material 114. The conductive pads 112 comprise contact pads or bond pads formed on a top surface of the semiconductor wafer 100, as examples. Some of the vias 110 couple conductive pads 112 to conductive lines 108 in the metallization structure 106, and other vias 110 couple contact pads 112 to the device region 104 of the workpiece 102. Vias 110 may also connect together conductive lines 108 in different metallization layers, not shown. The conductive features may comprise conductive materials typically used in BEOL processes, such as Cu, Al, W, Ti, TiN, Ta, TaN, or multiple layers or combinations thereof. In accordance with an embodiment, the conductive pads 112 disposed proximate a top surface of the metallization structure 106 comprise Cu or a copper alloy, for example. The metallization structure 106 shown is merely for illustrative purposes: the metallization structure 106 may comprise other configurations and may include one or more conductive line and via layers, for example. Some semiconductor wafers 100 may have three conductive line and via layers, or four or more conductive line and via layers, as other examples.

The semiconductor wafer 100 includes a plurality of semiconductor devices comprising portions of the workpiece 102 and the metallization layer 106 formed across the surface thereof, e.g., in a grid. The semiconductor devices comprise dies that may each be shaped in a square or rectangular pattern in a top view of the workpiece 102, as examples.

Figure 2:
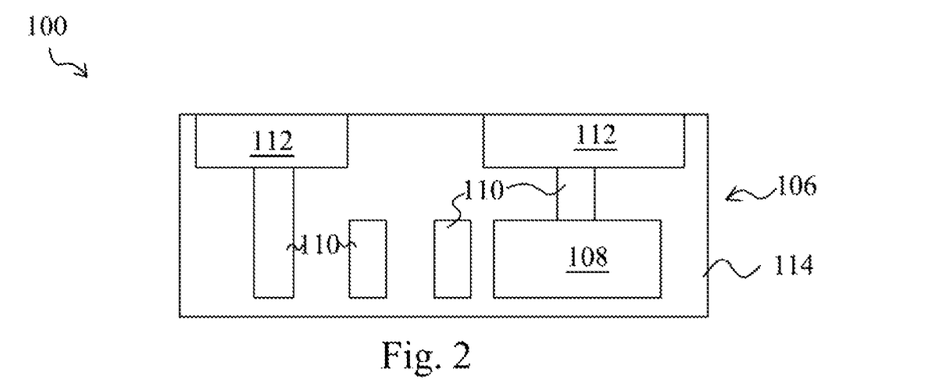
FIGS. 2 through 5 are cross-sectional views illustrating a wafer-to-wafer hybrid bonding method in accordance with an embodiment at various stages.

FIGS. 2 through 5 are cross-sectional views illustrating a method of hybrid bonding two semiconductor wafers 100 shown in FIG. 1 in accordance with an embodiment at various stages. FIG. 2 illustrates a more detailed view of a portion of the semiconductor wafer 100 shown in FIG. 1 that includes two conductive pads 112 disposed at the top surface of the metallization structure 106. Some of the vias 110 are coupled to the conductive pads 112 and also the conductive lines 108. The insulating material 114 comprises $SiO_2$, and the conductive pads 112 comprise Cu, in some embodiments. Alternatively, the insulating material 114 and the conductive pads 112 may comprise other materials.

The conductive pads 112 are formed in some embodiments using a damascene process, wherein the insulating material 114 is deposited over the workpiece 102, and the insulating material 114 is patterned using lithography. The patterned insulating material 114 is filled with a conductive material, and excess portions of the conductive material are removed from over the top surface of the insulating material 114 using a chemical mechanical polishing (CMP) process, an etch process, or combinations thereof. In other embodiments, a conductive material may be deposited and patterned using lithography, and the insulating material 114 is formed over the conductive material to form the conductive pads 112 using a subtractive etch process. The excess insulating material 114 is then removed from over the conductive pads 112 using a CMP process, an etch process, or combinations thereof.

In accordance with some embodiments of the present disclosure, after the formation of the conductive pads 112, a CMP process is performed near an end of the fabrication process of the semiconductor wafer 100.

Figure 3:
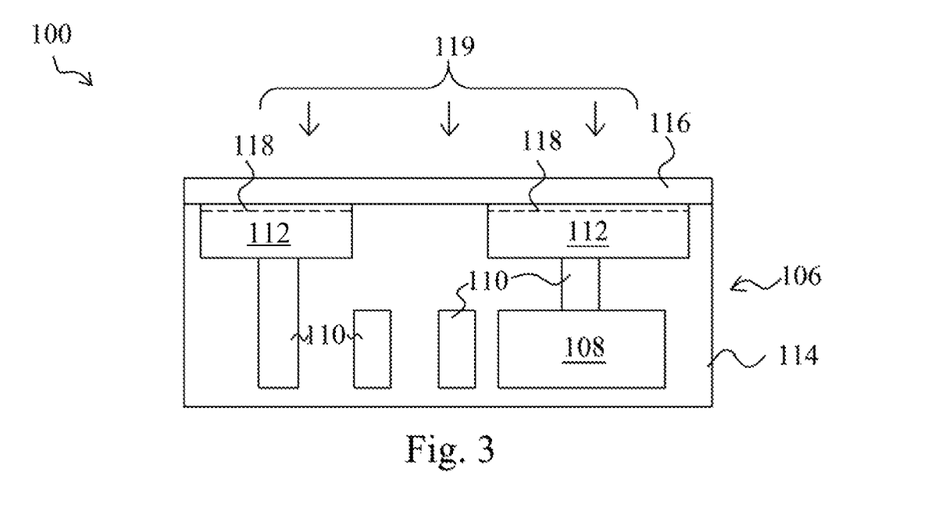

After the conductive pads 112 are formed and cleaned, a protection layer 116 is formed over the top surface of the semiconductor wafer 100, as shown in FIG. 3. The protection layer 116 comprises an insulating material, and may comprise C, Si, H, and/or combinations thereof. In some embodiments, the protection layer 116 includes C, Si, and H. Alternatively, the protection layer 116 may comprise other materials. The protection layer 116 comprises a material that is adapted to prevent formation of or relax an oxide material on the top surfaces of the first and second semiconductor wafers, e.g., on the top surfaces of the conductive pads 112. In some embodiments, a small portion of an oxide material 118 may be formed on top surfaces of the conductive pads 112 after the cleaning process, and the protection layer 116 relaxes the oxide material 118, minimizing further oxidation and preventing damage to the conductive pads 112.

The protection layer 116 is formed in some embodiments using a vapor type deposition process or a hydrophobic process having a contact angle of greater than about 60 degrees to the top surface of the semiconductor wafer 100. Alternatively, the protection layer 116 may be formed using other methods. The protection layer 116 comprises a thickness of about 100 Angstroms or less. Alternatively, the protection layer 116 may comprise other dimensions. In some embodiments, the protection layer 116 comprises a monolayer of material.

The semiconductor wafer 100 is then stored for a period of time in some embodiments. The semiconductor wafer 100 may be placed in a fabrication facility in storage or on a shelf for a period of time after the manufacturing process is completed, for example. Advantageously, the amount of time that the semiconductor wafer 100 may be stored is increased, due to the presence of the protection layer 116, which prevents or relaxes the formation of an oxide material on the top surfaces of the conductive pads 112. The protection layer 116 prevents the formation of Cu oxide on top surfaces of the conductive pads 112, in embodiments where the conductive pads 112 comprise Cu or Cu alloys, for example.

Figure 6:
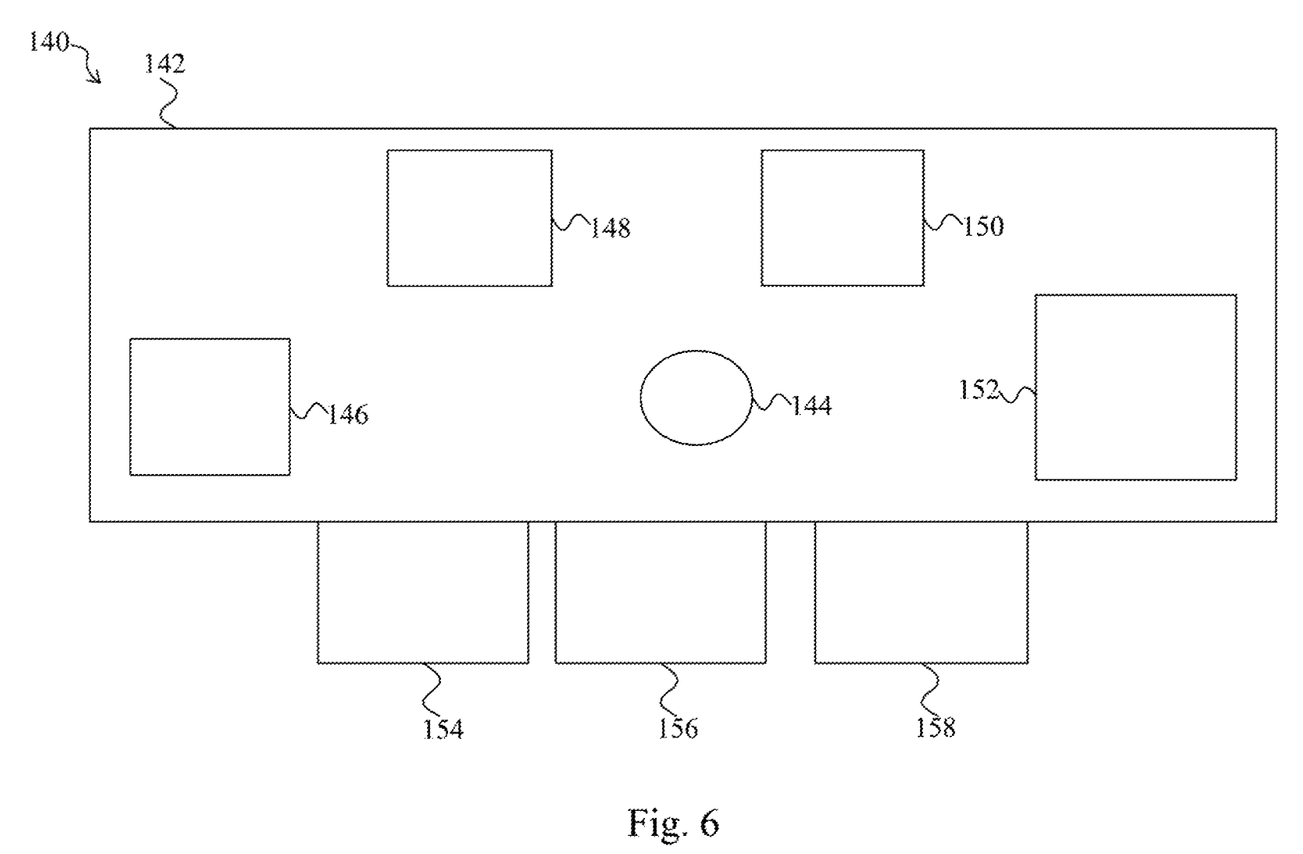
FIG. 6 illustrates a single platform system for hybrid bonding semiconductor wafers together in accordance with an embodiment.

When it is time for the semiconductor wafer 100 to be packaged using a 3DIC process with another semiconductor wafer 100, the wafer 100 is placed into a chamber 142 (not shown in FIG. 3; see FIG. 6, to be described further herein.) The protection layer 116 is removed from the top surface of the wafer 100 using a removal process 119, shown in FIGS. 3 and 4. The removal process 119 may comprise exposure of the wafer 100 to an acid, exposure to HCOOH, exposure to HCl, thermal decomposition, thermal desorption, exposure to a plasma removal treatment, exposure to ultraviolet (UV) light, or a combination thereof, as examples. Alternatively, the removal process 119 may comprise other types of removal processes.

Figure 4:
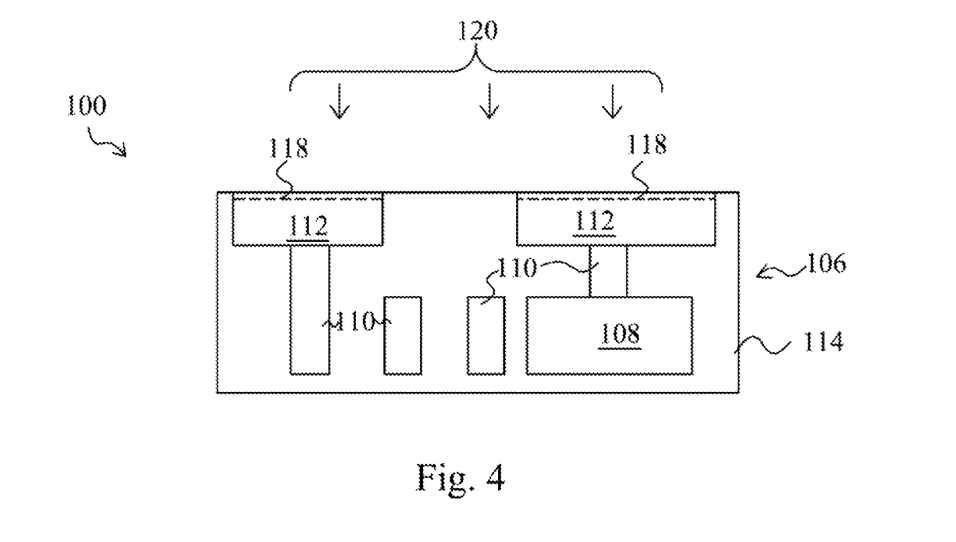

Before the protection layer 116 is formed, an oxide material 118 may begin forming soon after a final fabrication step on top surfaces of the conductive pads 112, depending on the manufacturing environment, for example, because Cu oxidizes easily. The oxide material 118 may comprise copper oxide ($CuO_x$) for example, by exposure of the Cu conductive pads 112 to oxygen in the ambient air. The oxide material 118 may comprise other materials, depending on the type of material of the conductive pads 112, for example. Removal of the oxide material 118 from the top surfaces of the conductive pads 112 is important to achieve a high quality hybrid bond to another semiconductor wafer 100, to avoid high resistance connections between the wafers 100. Advantageously, in some embodiments, a portion of or all of the oxide material 118 is removed during the removal process 119 used to remove the protection layer 116 from the top surface of the wafer 100. The removal process 119 may also clean the top surface of the wafer 100, in some embodiments. The removal process 119 of the protection layer 116 is performed without removing the wafer 100 from the chamber 142, to avoid forming any additional oxide material 118 on the top surface of the conductive pads 112.

Next, the top surface of the wafer 100 is activated using an activation process 120, as shown in FIG. 4. The activation process 120 comprises activating the top surfaces of the wafer 100 with plasma at a power density of less than about 1,000 Watts, for example, in some embodiments. Alternatively, other methods and power levels may be used. A surface roughness of the top surface of the wafer 100 is not substantially altered by the activation process 120, and may comprise a root mean square (RMS) of less than about 5 Angstroms in an embodiment. The activation process 120 may also clean the top surface of the wafer 100 in some embodiments. If any oxide material 118 is left remaining on the top surface of the contact pads 112 after the removal process 119 for the protection layer 116, a portion of or all of the remaining oxide material 118 may be removed during the activation process 120, in some embodiments, for example. The activation process 120 is performed after the removal process 119 without removing the wafer 100 from the chamber 142, to avoid forming any additional oxide material 118 on the top surface of the conductive pads 112.

After the activation process 120, the wafers 100 may be cleaned in some embodiments. The cleaning process may comprise exposure to deionized (DI) H$_2$O, exposure to NH$_4$OH, exposure to diluted hydrofluoric acid (DHF) (e.g., at a concentration of less than about 1% HF acid), exposure to other acids, a cleaning process with a brush, a mega-sonic procedure, a spin process, exposure to an infrared (IR) lamp, or a combination thereof, as examples, although alternatively, the cleaning process may comprise other types of cleaning processes. The cleaning process enhances a density of a hydroxy group disposed on top surfaces of the wafer 100 in some embodiments, e.g., on the top surface of the conductive pads 112. Enhancing the density of the hydroxy group on the conductive pads 112 advantageously increases bonding strength and reduces the anneal temperature required for the hybrid bonding process, for example. The cleaning process is performed without removing the wafer 100 from the chamber 142, again, to avoid forming any additional oxide material 118 on the top surface of the conductive pads 112.

The removal process 119, the activation process 120 and the cleaning process are adapted to prepare the top surface of the wafer 100 for hybrid bonding to another wafer 100, for example, so that the top surfaces of the wafers 100 are as clean as possible so that a high quality hybrid bond is formed between two or more wafers 100. The removal process 119, the activation process 120, and the cleaning process assist in the hybrid bonding of two or more wafers 100, advantageously allowing the use of lower pressures and temperatures in a subsequent hybrid bonding process. The removal process 119, the activation process 120 and/or the cleaning process may be used to remove a portion of or all of the oxide material 118. A consideration of a selection of chemistries for portions of the removal process 119, the activation process 120 and/or the cleaning process may include the following reactions, to reduce an oxide material 118 comprising CuO$_x$, as an example:

CuO+HCOOH→Cu(COOH)$_2$+H2O;

Cu(HCOOH)$_2$→Cu+CO$_2$+H$_2$; or

CuO+H$_2$→Cu+H$_2$O.

Figure 5:
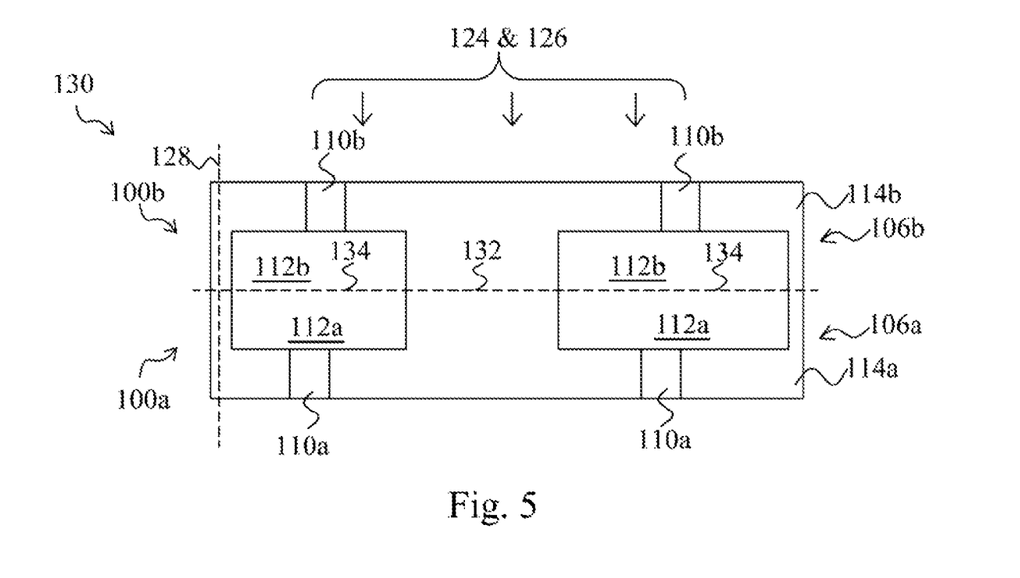

After the cleaning process, next, without removing the wafer 100 from the chamber 142, the wafer 100 shown in FIG. 4 is hybrid bonded to another wafer 100. FIG. 5 illustrates two semiconductor wafers 100a and 100b that are bonded together using a hybrid bonding process by coupling a top surface of one semiconductor wafer 100b to a top surface of another semiconductor wafer 100a. The wafers comprise a first semiconductor wafer 100a and a second semiconductor wafer 100b that have been processed using the procedures described herein for wafer 100 shown in FIGS. 1 through 4. The top surface of the second semiconductor wafer 100b is coupled to the top surface of the first semiconductor wafer 100a. The second semiconductor wafer 100b is inverted, i.e., rotated 90 degrees, from the view shown in FIG. 4, for example.

The bonding of the second semiconductor wafer 100b to the first semiconductor wafer 100a is achieved by aligning the conductive pads 112b on the second semiconductor wafer 100b with the conductive pads 112a on the first semiconductor wafer 100a, as shown in FIG. 5. The alignment of the wafers 100a and 100b may be achieved using optical sensing, as an example. Top surfaces of the insulating material 114b of the second semiconductor wafer 100b are also aligned with top surfaces of the insulating material 114a of the first semiconductor wafer 100a.

After the alignment process of the wafers 100a and 100b, the wafers 100a and 100b are hybrid bonded together by applying pressure 124 and heat 126, as shown in FIG. 5. The pressure 124 applied may comprise a pressure of less than about 30 MPa, and the heat 126 applied may comprise an anneal process at a temperature of about 100 to 500 degrees C., as examples, although alternatively, other amounts of pressure 124 and heat 126 may be used for the hybrid bonding process. The grain size of the Cu of the conductive pads 112 may comprise about 0.1 to 5 μm after the anneal process, with a bond strength larger than about 1.0 J/m$^2$ in an embodiment, for example. The hybrid bonding process may be performed in a N$_2$ environment, an Ar environment, a He environment, an (about 4 to 10% H$_2$)/(about 90 to 96% inert gas or N$_2$) environment, an inert-mixing gas environment, combinations thereof, or other types of environments. The ambient environment in the chamber 142 contains a minimal amount of or no amount of O$_2$, to prevent the oxidation of the conductive pads 112a and 112b before or during the hybrid bonding process, for example, in some embodiments.

The hybrid bonding process results in a bond 132 that is formed between the insulating materials 114a and 114b of the first and second semiconductor wafers 100a and 100b, respectively. A bond 134 is also formed between the conductive pads 112a and 112b of the first and second semiconductor wafers 100a and 100b, respectively. Bonds 132 comprise non-metal-to-non-metal bonds, and bonds 134 comprise metal-to-metal bonds. A portion of the hybrid bonding process may comprise a fusion process that forms the non-metal-to-non-metal bonds 132, and a portion of the hybrid bonding process may comprise a copper-to-copper bonding process that formed the metal-to-metal bonds 134, for example. The term "hybrid" refers to the formation of the two different types of bonds 132 and 134 using a single bonding process, rather than forming only one type of bond 132 or 134, as is the practice in other types of wafer-to-wafer bonding processes, for example.

The resulting 3DIC structure 130 shown in FIG. 5 includes the stacked and bonded first and second semiconductor wafers 100a and 100b. The first and second semiconductor wafers 100a and 100b are then sawed along scribe lines 128 that are arranged in a grid shape in a top view, and the packaged 3DIC semiconductor devices on the wafers 100a and 100b are separated from one another (not shown).

FIG. 6 illustrates a single platform system 140 for hybrid bonding semiconductor wafers 100, 100a, and 100b together in accordance with an embodiment. The system 140 includes a chamber 142 in which the semiconductor wafers 100, 100a, and 100b are hybrid bonded using the processes described herein. A robotics handler 144 is disposed within the chamber that is adapted to move the semiconductor wafers 100, 100a, and 100b to a desired location for processing inside and outside of the chamber 140. A plurality of sub-chambers 146, 148, 150, and 152 are disposed within the chamber 140. A plurality of ports 154, 156, and 158 exterior to the chamber 140 are disposed proximate the robotics handler 144. The ports 154, 156, and 158 provide entry and exit of the semiconductor wafers 100, 100a, and 100b into and out of the chamber 140.

Port 154 comprises a first load port that is adapted to support a plurality of the first semiconductor wafers 100a, and port 156 comprises a second load port that is adapted to support a plurality of the second semiconductor wafers 100b that will be hybrid bonded to the first semiconductor wafers 100a. Ports 154 and 156 comprise locations wherein one or more wafers 100a and 100b having a protection layer 116 thereon are placed or stacked at the beginning of the hybrid bonding process. The robotics handler 144 moves one semiconductor wafer 100a from the port 154 into the chamber 142, and through the chamber 142 into sub-chamber 146. Sub-chamber 146 comprises a sub-chamber that is adapted to remove the protection layer 116 from the semiconductor wafer 100a; e.g., the sub-chamber 146 include ports and lines coupled thereto wherein the appropriate chemicals and gases can be entered into the sub-chamber 146 for processing. Sub-chamber 146 comprises a baking chamber in an embodiment. The protection layer 116 is removed from the wafer 100a using the removal process 119 described herein, and the robotics handler 144 then moves the wafer 100a into the next sub-chamber 148 that is adapted to activate the top surface of the wafer 100a. Sub-chamber 148 comprises a plasma chamber in an embodiment. The top surfaces of the wafer 100a are activated in the sub-chamber 148, and the robotics handler 144 moves the wafer 100a into the next sub-chamber 150 that is adapted to clean the wafer 100a. Sub-chamber 150 comprises a cleaning module for wafer cleaning in an embodiment. The wafer 100a is cleaned in sub-chamber 150, and the robotics handler 144 moves the wafer 100a to the next sub-chamber 152 that is adapted to align and hybrid bond the first semiconductor wafer 100a to a second semiconductor wafer 100b. Sub-chamber 152 comprises a wafer-to-wafer align and bonding module in an embodiment.

Next, or sequentially and simultaneously with the processing of the first semiconductor wafer 100a, a second semiconductor wafer 100b is processed as described for the first semiconductor wafer 100a by the robotics handler 144 and the various sub-chambers 146, 148, and 150, after moving one of the second semiconductor wafers 100b from the port 156 into the chamber 142. After cleaning the second semiconductor wafer 100b in sub-chamber 150, the wafer 100b is also moved into sub-chamber 152, and the first and second wafers 100a and 100b are aligned and hybrid bonded together. After the hybrid bonding process, the hybrid bonded wafers 130 (see FIG. 5) are moved by the robotics handler 144 to the port 158 that comprises a load port adapted to support a plurality of the first and second semiconductor wafers 100a and 100b that have been bonded together using the system 140. Load port 158 may comprise a stacking lot in an embodiment, for example.

The protection layer 116 is removed in a separate sub-chamber 146, the top surface of the wafers 100, 100a, and 100b are activated in a separate sub-chamber 148, and the top surfaces of the wafers 100, 100a, and 100b are cleaned in a separate sub-chamber 150 in accordance with some embodiments. A top surface of a second semiconductor wafer 100b is coupled and aligned to a first semiconductor wafer 100a and a hybrid bonding process for the wafers 100a and 100b is performed within a single sub-chamber 152 within the chamber 140, in accordance with other embodiments. The alignment of the wafers 100a and 100b is performed using an optical system comprising a visual light range system operable at about 300 nm to about 750 nm, an infrared (IR) light range system operable at about 800 nm to 1,000 nm, a reflective (IR) system, or combinations thereof, in some embodiments, as examples. Alternatively, other types of optical alignment systems may be used to align the wafers 100a and 100b. The optical alignment system may be located in sub-chamber 152 or proximate sub-chamber 152, for example.

The hybrid bonding system 140 advantageously comprises a single platform wherein a plurality of wafers 100a and 100b are hybrid bonded in a single chamber 142, without exposure to oxygen or with minimal exposure to oxygen, avoiding the formation of oxide material 118 on the conductive pads 112 upon movement of the wafers 100a and 100b between the various sub-chambers 146, 148, 150, and 152, resulting in hybrid bonded wafers 130 having a high quality hybrid bonds; e.g., bonds 132 between the insulating materials 114a and 114b and bonds 134 between conductive pads 112a and 112b of the wafers 100a and 100b previously described herein with respect to FIG. 5. In some embodiments, a handling time period for the system 140 between cleaning the plurality of semiconductor wafers in sub-chamber 150 and hybrid bonding the plurality of semiconductor wafers in sub-chamber 152 comprises about 30 minutes or less, for example, further reducing the risk of oxide material 118 formation.

Figure 7:
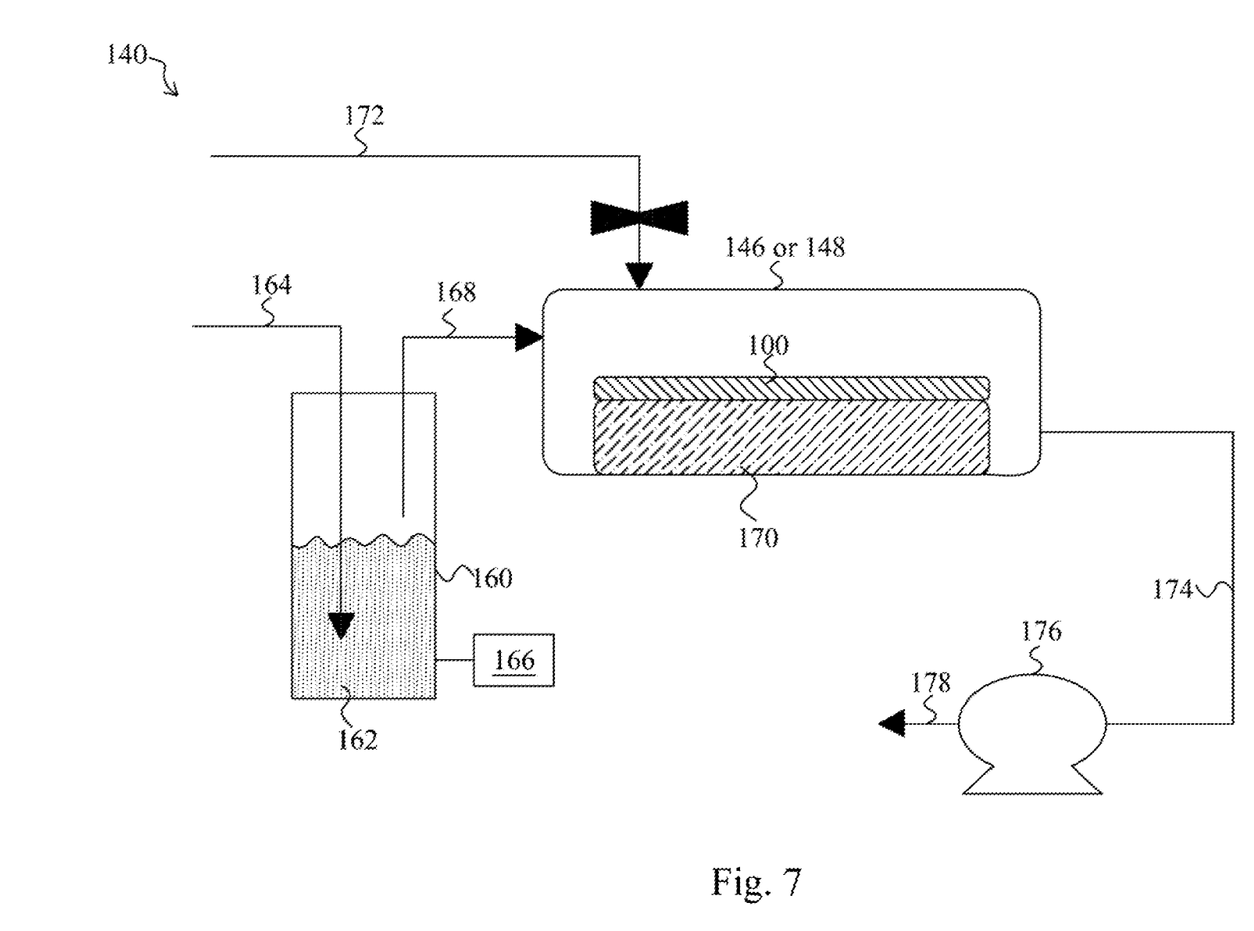
FIG. 7 illustrates additional portions of the system shown in FIG. 6 in accordance with an embodiment.

FIG. 7 illustrates additional portions of the system 140 shown in FIG. 6 in accordance with an embodiment. An example is shown of various components that can be coupled to the sub-chambers 146, 148, 150, or 152 so that the sub-chambers 146, 148, 150, or 152 are adapted to perform the required processing on the wafers 100, 100a, and 100b. An example of components that may be coupled to a sub-chamber 146 for removing the protection layer 116 or a sub-chamber 148 for activating the top surface of a wafer 100 is shown. The sub-chamber 146 or 148 includes a heated support 170 for supporting and heating a semiconductor wafer 100. A purge line 172 is coupled to the sub-chamber 146 or 148, and a vat 160 comprising a container or vessel adapted to store an acid 162 or other chemical(s) needed for processing the wafer 100 is connected to the sub-chamber 146 or 148 by a line 168. The acid 162 enters the vat 160 by a line 164. A pump 176 is coupled to the sub-chamber 146 or 148 by a line 174. The pump 176 is adapted to remove residues from the processing of the wafer 100 using line 178. The lines 172, 164, 168, 174, and 178 may comprise pipes or hoses, as examples. The vat 160 may have a bubbler 166 coupled thereto in some embodiments, depending on the chemistries and processes used.

Figure 8:
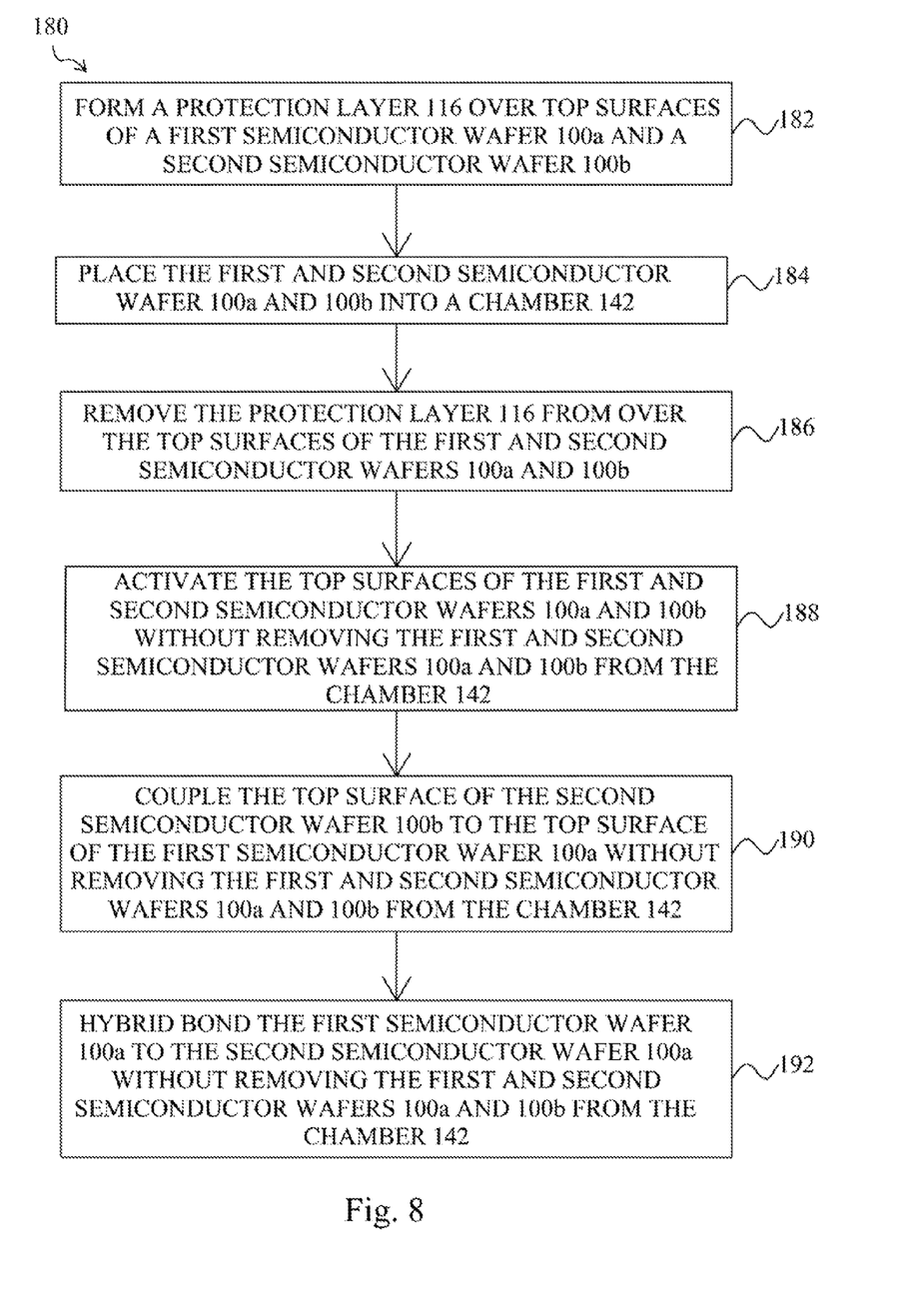
FIG. 8 is a flow chart of a method of forming a 3DIC structure using a hybrid bonding process in accordance with an embodiment.

FIG. 8 is a flow chart 180 of a method of forming a 3DIC structure 130 using a hybrid bonding process in accordance with an embodiment. In step 182, a protection layer 116 is formed over top surfaces of a first semiconductor wafer 100a and a second semiconductor wafer 100b. The wafers 100a and 100b may then be stored for a period of time before the hybrid bonding process. In step 184, the first and second semiconductor wafers 100a and 100b are placed into a chamber 142. The protection layer 116 is removed from over the top surfaces of the first and second semiconductor wafers 100a and 100b in step 186, in sub-chamber 146 in the chamber 142. In step 188, the top surfaces of the first and second semiconductor wafers 100a and 100b are activated 188 in sub-chamber 148 in the chamber 142, without removing the first and second semiconductor wafers 100a and 100b from the chamber 142. The first and second semiconductor wafers 100a and 100b may also be cleaned in sub-chamber 150 in the chamber 142 (not shown). In some embodiments, a cleaning step and a cleaning sub-chamber 150 may not be required; the wafers 100a and 100b may be sufficiently cleaned using the removal process 119 for the protection layer 116 and the activation process 120, for example. In step 190, the top surface of the second semiconductor wafer 100b is coupled to the top surface of the first semiconductor wafer 100a in sub-chamber 152, without removing the first and second semiconductor wafers 100a and 100b from the chamber 142. In step 192, the first and second semiconductor wafers 100a and 100b are hybrid bonded together in sub-chamber 152, without removing the first and second semiconductor wafers 100a and 100b from the chamber 142.

Three or more semiconductor wafers 100, 100a, and 100b may be stacked vertically and hybrid bonded together using the methods described herein. Exposed ends of TSVs 105 of the workpiece 102 (see FIG. 1) may be coupled to conductive pads 112 on another semiconductor wafer 100, 100a, or 100b, for example. Alternatively, an additional connecting layer including conductive pads 112 may be formed over exposed ends of the TSVs 105, which may be used to hybrid bond to another wafer 100, 100a, or 100b, as another example.

One or more semiconductor devices on the second semiconductor wafer 100b is hybrid bonded to each semiconductor device on the first semiconductor wafer 100a using the hybrid bonding process described herein. The semiconductor devices on the semiconductor wafers 100, 100a and 100b may include a device type such as a semiconductor die, an electrical circuit, a photo diode, a micro-electrical-mechanical system (MEMS) device, a bio-sensing device, a complementary metal oxide (CMOS) device, a digital image sensor, an application specific integrated circuit (ASIC) device, or combinations thereof, as examples. One semiconductor wafer 100a may comprise a plurality of dies, with each die comprising a processor, and the other semiconductor wafer 100b may comprise one or more memory devices that are coupled to and packaged with each of the processors on the other semiconductor wafer 100a, as one example. In other embodiments, one semiconductor wafer 100b may comprise digital image sensors including a plurality of photo diodes formed thereon, and the other semiconductor wafer 100a may comprise dies having support circuitry thereon for the digital image sensors, as another example. The support circuitry may comprise ASIC devices, for example. One wafer 100b may be adapted to enhance photosensitivity in another wafer 100a, in other embodiments. Other combinations of types of semiconductor wafers 100, 100a, and 100b and semiconductor devices may be packaged together in a 3DIC structure in accordance with embodiments herein, using the novel hybrid bonding methods described herein, depending on the application.

Embodiments of the present disclosure include methods of hybrid bonding semiconductor wafers to form 3DIC structures 130, and also include systems 140 adapted to perform the methods of hybrid bonding described herein. In some embodiments, the plurality of conductive pads of the first semiconductor wafer and the second semiconductor wafer comprise Cu, and the insulating materials of the first semiconductor wafer and the second semiconductor wafer comprise $SiO_2$, wherein the hybrid bonding methods described herein comprise a $Cu/SiO_2$ wafer level hybrid bonding process.

Advantages of embodiments of the disclosure include providing novel hybrid bonding methods and systems 140 that provide high quality hybrid bonds for 3DICs. The innovating methods and systems 140 provide the ability to remove protection layers 116 and reduce the formation of oxide material 118 on conductive pads 112 in a hybrid bond procedure in a single platform. Integrating the hybrid bonding process into a single platform reduces cost of ownership (CoO). The protection layer 116 insulates the conductive pad 112 surface and also prevents or relaxes oxide material 118 formation. The protection layer 116 provides the ability to increase a storage time (Q), comprising a time period between forming the protection layer 116 and hybrid bonding wafers 100 together. A Q of greater than about 1 day (e.g., weeks or months or more) is advantageously achievable by embodiments of the present disclosure, for example; thus, a concern of shortening Q time is eliminated in the hybrid bonding procedure. The novel hybrid bonding methods and systems 140 lower contact resistance of the bonds of the conductive pads 112a and 112b, by reducing or eliminating oxide layers 118 between the conductive pads 112a and 112b.

A high accuracy in alignment of the wafers 100a and 100b in the hybrid bonding process is achieved. The use of lower forces, pressure 124, and heat 126 may be used for hybrid bonding the wafers 100a and 100b due to the decreased amount of oxide material 118 and highly activated and cleaned top surfaces of the wafers 100a and 100b, preventing the introduction of mechanical and thermal stress to and distortion of the semiconductor devices on the wafers 100a and 100b. The hybrid bonding methods described herein are advantageously compatible with complementary metal oxide semiconductor (CMOS) processes and materials. The novel hybrid bonding methods and systems 140 are easily implementable in semiconductor manufacturing and packaging process flows and fabrication facilities.

In accordance with one embodiment of the present disclosure, a hybrid bonding system for semiconductor wafers includes a chamber and a plurality of sub-chambers disposed within the chamber. A robotics handler is disposed within the chamber that is adapted to move a plurality of semiconductor wafers within the chamber between the plurality of sub-chambers. The plurality of sub-chambers includes a first sub-chamber adapted to remove a protection layer from the plurality of semiconductor wafers, and a second sub-chamber adapted to activate top surfaces of the plurality of semiconductor wafers prior to hybrid bonding the plurality of semiconductor wafers together. The plurality of sub-chambers also includes a third sub-chamber adapted to align the plurality of semiconductor wafers and hybrid bond the plurality of semiconductor wafers together.

In accordance with another embodiment, a hybrid bonding method for semiconductor wafers includes forming a protection layer over top surfaces of a first semiconductor wafer and a second semiconductor wafer, and placing the first semiconductor wafer and the second semiconductor wafer into a chamber. The protection layer is removed from over the top surfaces of the first semiconductor wafer and the second semiconductor wafer, and the top surfaces of the first semiconductor wafer and the second semiconductor wafer are activated. The method includes coupling the top surface of the second semiconductor wafer to the top surface of the first semiconductor wafer, and hybrid bonding the first semiconductor wafer to the second semiconductor wafer. Removing the protection layer, activating the top surfaces, coupling the top surface of the second semiconductor wafer to the top surface of the first semiconductor wafer, and hybrid bonding the first semiconductor wafer to the second semiconductor wafer are performed without removing the first semiconductor wafer and the second semiconductor wafer from the chamber.

In accordance with yet another embodiment, a hybrid bonding method for semiconductor wafers includes providing a first semiconductor wafer and a second semiconductor wafer, the first semiconductor wafer and the second semiconductor wafer each having a plurality of conductive pads disposed within an insulating material on a top surface thereof. A protection layer is formed over the top surfaces of the first semiconductor wafer and the second semiconductor wafer, and the first semiconductor wafer and the second semiconductor wafer are placed into a chamber. The protection layer is removed from over the top surfaces of the first semiconductor wafer and the second semiconductor wafer, and the top surfaces of the first semiconductor wafer and the second semiconductor wafer are activated. The top surfaces of the first semiconductor wafer and the second semiconductor wafer are cleaned, and the top surfaces of the second semiconductor wafer and the first semiconductor wafer are coupled together. The first semiconductor wafer is hybrid bonded to the second semiconductor wafer. Hybrid bonding the first semiconductor wafer to the second semiconductor wafer includes forming a first bond between the insulating material of the first semiconductor wafer and the insulating material of the second semiconductor wafer and forming a second bond between the plurality of conductive pads of the first semiconductor wafer and the plurality of conductive pads of the second semiconductor wafer. Removing the protection layer, activating the top surfaces, cleaning the top surfaces, coupling together the top surfaces, and hybrid bonding the first semiconductor wafer to the second semiconductor wafer are performed without removing the first semiconductor wafer and the second semiconductor wafer from the chamber.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A hybrid bonding method for semiconductor wafers, the method comprising:
    forming a protection layer over top surfaces of a first semiconductor wafer and a second semiconductor wafer;
    placing the first semiconductor wafer and the second semiconductor wafer into a chamber;
    removing the protection layer from over the top surfaces of the first semiconductor wafer and the second semiconductor wafer;
    activating the top surfaces of the first semiconductor wafer and the second semiconductor wafer;
    coupling the top surface of the second semiconductor wafer to the top surface of the first semiconductor wafer; and
    hybrid bonding the first semiconductor wafer to the second semiconductor wafer; wherein removing the protection layer, activating the top surfaces, coupling the top surface of the second semiconductor wafer to the top surface of the first semiconductor wafer, and hybrid bonding the first semiconductor wafer to the second semiconductor wafer are performed without removing the first semiconductor wafer and the second semiconductor wafer from the chamber.

2. The method according to claim 1, wherein removing the protection layer comprises a method selected from the group consisting essentially of exposure to an acid, exposure to HCOOH, exposure to HCl, thermal decomposition, thermal desorption, exposure to a plasma removal treatment, exposure to ultraviolet (UV) light, and combinations thereof.

3. The method according to claim 1, further comprising cleaning the top surfaces of the first semiconductor wafer and the second semiconductor wafer, after activating the top surfaces.

4. The method according to claim 3, wherein removing the protection layer, activating the top surfaces, and cleaning the top surfaces are each performed in a separate sub-chamber within the chamber.

5. The method according to claim 1, wherein coupling the top surface of the second semiconductor wafer to the top surface of the first semiconductor wafer and hybrid bonding the first semiconductor wafer to the second semiconductor wafer are performed in a single sub-chamber within the chamber.

6. The method according to claim 1, wherein forming the protection layer comprises forming a material selected from the group consisting essentially of C, Si, H, and combinations thereof.

7. The method according to claim 1, wherein forming the protection layer comprises forming a material having a thickness of about 100 Angstroms or less, or wherein forming the protection layer comprises forming a monolayer of material.

8. The method according to claim 1, wherein removing the protection layer or activating the top surfaces also comprises cleaning the top surfaces of the first semiconductor wafer and the second semiconductor wafer.

9. A hybrid bonding method for semiconductor wafers, the method comprising:
    providing a first semiconductor wafer and a second semiconductor wafer, the first semiconductor wafer and the second semiconductor wafer each having a plurality of conductive pads disposed within an insulating material on a top surface thereof;
    forming a protection layer over the top surfaces of the first semiconductor wafer and the second semiconductor wafer;
    placing the first semiconductor wafer and the second semiconductor wafer into a chamber;
    removing the protection layer from over the top surfaces of the first semiconductor wafer and the second semiconductor wafer;
    activating the top surfaces of the first semiconductor wafer and the second semiconductor wafer;
    cleaning the top surfaces of the first semiconductor wafer and the second semiconductor wafer;
    coupling together the top surfaces of the second semiconductor wafer and the first semiconductor wafer; and
    hybrid bonding the first semiconductor wafer to the second semiconductor wafer, wherein hybrid bonding the first semiconductor wafer to the second semiconductor wafer comprises forming a first bond between the insulating material of the first semiconductor wafer and the insulating material of the second semiconductor wafer and forming a second bond between the plurality of conductive pads of the first semiconductor wafer and the plurality of conductive pads of the second semiconductor wafer; and wherein removing the protection layer, activating the top surfaces, cleaning the top surfaces, coupling together the top surfaces, and hybrid bonding the first semiconductor wafer to the second semiconductor wafer are performed without removing the first semiconductor wafer and the second semiconductor wafer from the chamber.

10. The method according to claim 9, wherein the top surfaces of the first semiconductor wafer and the second semiconductor wafer include an oxide material formed thereon, and wherein removing the protection layer or activating the top surfaces comprises removing a portion of the oxide material.

11. The method according to claim 10, wherein the plurality of conductive pads comprises Cu or a Cu alloy, and wherein removing the portion of the oxide material comprises removing $CuO_x$.

12. The method according to claim 9, wherein cleaning the top surfaces comprises a method selected from the group consisting essentially of exposure to deionized (DI) $H_2O$, exposure to $NH_4OH$, exposure to diluted hydrofluoric acid (DHF), exposure to an acid, a cleaning with a brush, a megasonic procedure, a spin process, exposure to an infrared (IR) lamp, and combinations thereof.

13. The method according to claim 9, wherein hybrid bonding the first semiconductor wafer to the second semiconductor wafer is performed at a pressure of less than about 30 MPa or a temperature of about 100 to 500 degrees C.

14. The method according to claim 9, wherein a storage (Q) time comprising a time period between forming the protection layer and hybrid bonding the first semiconductor wafer to the second semiconductor wafer is greater than about 1 day.

15. A hybrid bonding method for semiconductor wafers, the method comprising:
   forming a first protection layer over a first top surface of a first semiconductor wafer, the first semiconductor wafer comprising a first conductive pad and a first oxide material at the first top surface;
   placing the first semiconductor wafer and a second semiconductor wafer into a chamber, wherein the second semiconductor wafer comprises a second conductive pad and a second oxide material at a second top surface of the second semiconductor wafer;
   removing the first protection layer from over the top surface of the first semiconductor wafer;
   coupling the first top surface to the second top surface, wherein coupling the first top surface to the second top surface comprises aligning the first conductive pad with the second conductive pad and aligning the first oxide material with the second oxide material; and
   hybrid bonding the first semiconductor wafer to the second semiconductor wafer, wherein removing the protection layer, coupling the first top surface to the second top surface, and hybrid bonding the first semiconductor wafer to the second semiconductor wafer are performed without removing the first semiconductor wafer and the second semiconductor wafer from the chamber.

16. The method according to claim 15, further comprising:
   before placing the second semiconductor wafer into the chamber, forming a second protection layer over the second top surface; and
   after placing the second semiconductor wafer into the chamber, removing the second protection layer.

17. The method according to claim 15, wherein forming the first protection layer comprises forming a material selected from the group consisting essentially of C, Si, H, and combinations thereof.

18. The method according to claim 15, wherein removing the first protection layer comprises a method selected from the group consisting essentially of exposure to an acid, exposure to HCOOH, exposure to HCl, thermal decomposition, thermal desorption, exposure to a plasma removal treatment, exposure to ultraviolet (UV) light, and combinations thereof.

19. The method according to claim 15, wherein an oxide layer is formed over the first conductive pad, and wherein removing the first protection layer comprises removing the oxide layer over the first conductive pad.

20. The method according to claim 15 further comprising:
   activating the first top surface and the second top surface; and
   cleaning the first top surface and the top surface, wherein activating and cleaning the first top surface and the second top surface are performed without removing the first semiconductor wafer and the second semiconductor wafer from the chamber.

* * * * *